United States Patent [19]

Chen et al.

[11] Patent Number: 5,757,823
[45] Date of Patent: May 26, 1998

[54] ERROR DETECTION AND CORRECTION FOR FOUR-BIT-PER-CHIP MEMORY SYSTEM

[75] Inventors: Chin-Long Chen, Fishkill; Mu-Yue Hsiao, Poughkeepsie, both of N.Y.

[73] Assignee: International Business Machines Corporation, Armonk, N.Y.

[21] Appl. No.: 538,691

[22] Filed: Oct. 3, 1995

[51] Int. Cl.[6] .................................................. H03M 13/00
[52] U.S. Cl. .................. 371/37.01; 371/40.4; 371/40.12; 371/40.17
[58] Field of Search ................................ 371/40.1, 40.4, 371/39.1, 37.6, 37.01, 40.12, 40.17

[56] References Cited

U.S. PATENT DOCUMENTS 4,961,193  10/1990  Debord et al. ........................ 371/37.2

OTHER PUBLICATIONS

Bossen, "b-Adjacent Error Correction", IBM Journal of Research and Development, Jul. 1970, pp. 402–408.

Chen, "Symbol Error-Correcting Codes for Computer Memory Systems", IEEE Transactions on Computers, vol. 41, No. 2, Feb. 1992, pp. 252–256.

Primary Examiner—Stephen M. Baker
Attorney, Agent, or Firm—Lawrence D. Cutter

[57] ABSTRACT

Advantage is taken of the presence of identity submatrices in a parity check matrix to achieve correction of errors in a single symbol and detection of errors in a single symbol together with a single bit error in another symbol for use in computer memory systems. The code structure enhances utilization of chip real estate and specifically provides for the utilization of a (76,64) code which employs 19 chips per computer memory word as opposed to 20 chips per word.

6 Claims, 3 Drawing Sheets

ERROR DETECTION AND CORRECTION FOR FOUR-BIT-PER-CHIP MEMORY SYSTEM

BACKGROUND OF THE INVENTION

The present invention is generally directed to error correction, detection and encoding systems found in digital memory devices. More particularly, the present invention is directed to multi-bit per chip computer memory systems in which error correction and detection apparatus are provided to achieve correction of all single symbol errors and the detection of all single symbol errors occurring with a single bit error in a second symbol.

In a b bit per chip computer memory, a chip failure may generate from one to b erroneous bits in the output data depending upon the failure mode and the data originally stored. A b bit symbol error pattern is used to indicate one of all of the possible $2^b-1$ error patterns in the b bits for each computer chip. Normal error correction and detection systems employed in such situations would involve the use of a single error correction and double error detection code. These socalled SEC-DED codes are not, however, effective in correcting symbol errors generated from single chip failures, nor are they effective in detecting symbol errors generated from double chip failures. On the other hand, a single symbol error correction and double symbol error detection code, a so-called SSC-DSD code, would provide an effective error correction and detection means to achieve high reliability in a b bit per chip memory. However, SSC-DSD codes require more check bits and more memory chips than are actually necessary for the problem. In particular, for a 64-bit data bus, the required SSC-DSD code would require four redundant memory chips for every 16 data chips to implement a (78,64) SSC-DSD code. Such codes would be 78 bits in length with 64 information bits and 14 check bits. Thus, a memory system implementing this code would require 20 chips based upon the above memory organization.

Recognizing that SSC-DSD code requirements are unnecessarily stringent for the memory system described above employing multi-bits per chip, the present inventors have devised a code that is capable of correcting all single symbol errors and detecting all single symbol errors plus a single bit error in a second symbol that is, from a second chip. Accordingly, the number of redundant memory chips required to implement this new coding scheme is only three for each set of 16 data chips. This is a saving in memory cost of approximately 5 percent. Given the high cost of computer memory systems for these situations which particularly require high reliability, it is seen that this is indeed a significant saving.

Accordingly, high reliability may be maintained by employing a memory system having the present code deployed therein particularly when coupled with a properly designed memory maintenance strategy. Data from any single chip failure is corrected properly by the code. For a failure mode that corrupts only a single output bit, the failing chip can stay in the memory. However, for a failure mode that corrupts more than one output bit, the failing chip is typically replaced by a good chip, either by a standby spare or during scheduled maintenance service. Using this strategy, when there are two chip failures involved in one code word, one of the two symbol errors is most likely to be a single bit error. Thus, double symbol errors are detectable with a very high degree of probability. Accordingly, an improved computer memory system is provided through the use of the present code without providing a significant increase in cost. All of these are desirable results.

SUMMARY OF THE INVENTION

In accordance with a preferred embodiment of the present invention, digital signal encoding and decoding is accomplished through the utilization of a parity check matrix for a memory system with k symbols and b bits per symbol. The resulting parity check matrix has kb columns and 3b rows. The rows and columns are divided up into k columns of submatrices. Each column of submatrices has three submatrices each with b rows and b columns. In accordance with a preferred embodiment of the present invention, at least one of these three b by b matrices is an identity matrix. In such an array it is guaranteed that for those syndrome bits corresponding to an error pattern for the particular one of the k possible symbol bits, the syndrome's corresponding b bits will represent the error pattern. By determining which one of the symbol columns is in error and by the knowledge of which one of the three matrices is an identity matrix for that particular symbol (chip), one can apply that portion of the syndrome to the data bits to correct the errors therein since that portion of the syndrome vector represents the error pattern. For each chip or symbol, the relevant subportion of the syndrome vector will vary; however, it is known ahead of time, for each symbol, which portion of the syndrome vector to use. That is, the relevant subsyndrome portion is known ahead of time and this fact is fully implemented in the circuits which perform the decoding operation.

Thus, in accordance with one embodiment of the present invention, a method for decoding digital signals begins by generating a syndrome vector in the usual fashion; at that point in time one may effectively generate a multiplicity k of multi-segmented subsyndrome vectors in which each segment in each of the k subsyndrome vectors is b bits long. For each of the k subsyndrome vectors it is determined which one matches the corresponding overall syndrome vector in all of its segments excepting the segment which represents the error pattern. Once the particular symbol and error is thus determined it then becomes a simple matter to correct the signal and those symbol bits for which the subsyndrome match is found. This correction is determined by the error pattern portion of that subsyndrome vector.

Accordingly, it is an object of the present invention to provide enhanced coding schemes for computer memory systems organized and constructed in multi-bit per chip configurations.

It is also an object of the present invention to improve the reliability and availability of electronic memory systems.

It is a still other object of the present invention to provide an error encoding and decoding mechanism which is capable of correcting single symbol errors and which is also capable of detecting errors occurring in any single symbol and having only one bit in error in another symbol (chip).

It is a further object of the present invention to produce reliable computer memory systems having reduced memory chip requirements.

It is yet another object of the present invention to provide error correction circuits, for a computer memory system, which operate quickly and which correspondingly consume significantly reduced levels of chip "real estate".

Lastly, but not limited hereto, it is an object of the present invention to provide a method for coding and decoding digital electrical signals particularly in those situations in which the signals arise from multiple relatively independent sources but yet which are treated together as a single word or entity in a computer system.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

The invention described below is particularly shown with respect to a particular example, namely the construction of a (76,64) code for a four-bit per chip computer memory system. However, the ideas presented herein are extensible to the general b bit per chip situation. In particular, it is noted that the number of rows of b by b submatrices in the parity check matrix is determined by the error correction capabilities that are desired. In the particular instance of the codes constructed in accordance with the present invention, three rows of b by b submatrices are sufficient to provide the desired correction and detection capabilities. Likewise in general, codes constructed in accordance with the present invention will have k symbols. Each symbol will be represented by b bits. Since three of the symbols are employed for redundancy, there are thus k-3 information symbols and 3 symbols which comprise check bits.

With respect to the present invention for a (76,64) code, the parity check matrix for this code is given below:

TABLE I

| | | | | | DATA | | | | | | | | | | | ECC | | | SYMBOL ID |
|---|---|---|---|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | 16 | 17 | 18 | 19 | (CHIP ID) |
| 1000 | 1000 | 1000 | 1000 | 1000 | 1000 | 1000 | 1000 | 1001 | 1101 | 1111 | 0011 | 1100 | 1100 | 1110 | 0110 | 1000 | 0000 | 0000 | |
| 0100 | 0100 | 0100 | 0100 | 0100 | 0100 | 0100 | 0100 | 0111 | 1011 | 1010 | 1010 | 1000 | 1000 | 1001 | 1101 | 0100 | 0000 | 0000 | |
| 0010 | 0010 | 0010 | 0010 | 0010 | 0010 | 0010 | 0010 | 0111 | 0110 | 1100 | 1111 | 0011 | 0011 | 1001 | 1011 | 0010 | 0000 | 0000 | |
| 0001 | 0001 | 0001 | 0001 | 0001 | 0001 | 0001 | 0001 | 1110 | 1101 | 1000 | 1010 | 0010 | 0010 | 0111 | 0110 | 0001 | 0000 | 0000 | |
| 0110 | 1000 | 0010 | 1011 | 1010 | 1101 | 0101 | 1110 | 1000 | 0001 | 1000 | 0111 | 1000 | 1110 | 1000 | 0100 | 0000 | 1000 | 0000 | |
| 1101 | 0100 | 0001 | 0110 | 0101 | 1011 | 1111 | 1001 | 0100 | 0011 | 0100 | 1110 | 0100 | 1001 | 0100 | 1100 | 0000 | 0100 | 0000 | |
| 1011 | 0010 | 1010 | 1101 | 1000 | 0110 | 0100 | 1001 | 0010 | 0101 | 0010 | 1110 | 0010 | 1001 | 0010 | 0001 | 0000 | 0010 | 0000 | |
| 0110 | 0001 | 0101 | 1011 | 0100 | 1101 | 1100 | 0111 | 0001 | 1111 | 0001 | 1001 | 0001 | 0111 | 0001 | 0011 | 0000 | 0001 | 0000 | |
| 1000 | 1110 | 0111 | 1010 | 1001 | 0010 | 0110 | 0001 | 0101 | 1000 | 1011 | 1000 | 0110 | 1000 | 0100 | 1000 | 0000 | 0000 | 1000 | |
| 0100 | 1001 | 1110 | 0101 | 0111 | 0001 | 1101 | 0011 | 1111 | 0100 | 0110 | 0100 | 1101 | 0100 | 1100 | 0100 | 0000 | 0000 | 0100 | |
| 0010 | 1001 | 1110 | 1000 | 0111 | 1010 | 1011 | 0101 | 0100 | 0010 | 1101 | 0010 | 1011 | 0010 | 0001 | 0010 | 0000 | 0000 | 0010 | |
| 0001 | 0111 | 1001 | 0100 | 1110 | 0101 | 0110 | 1111 | 1100 | 0001 | 1011 | 0001 | 0110 | 0001 | 0011 | 0001 | 0000 | 0000 | 0001 | |

Figure 1:
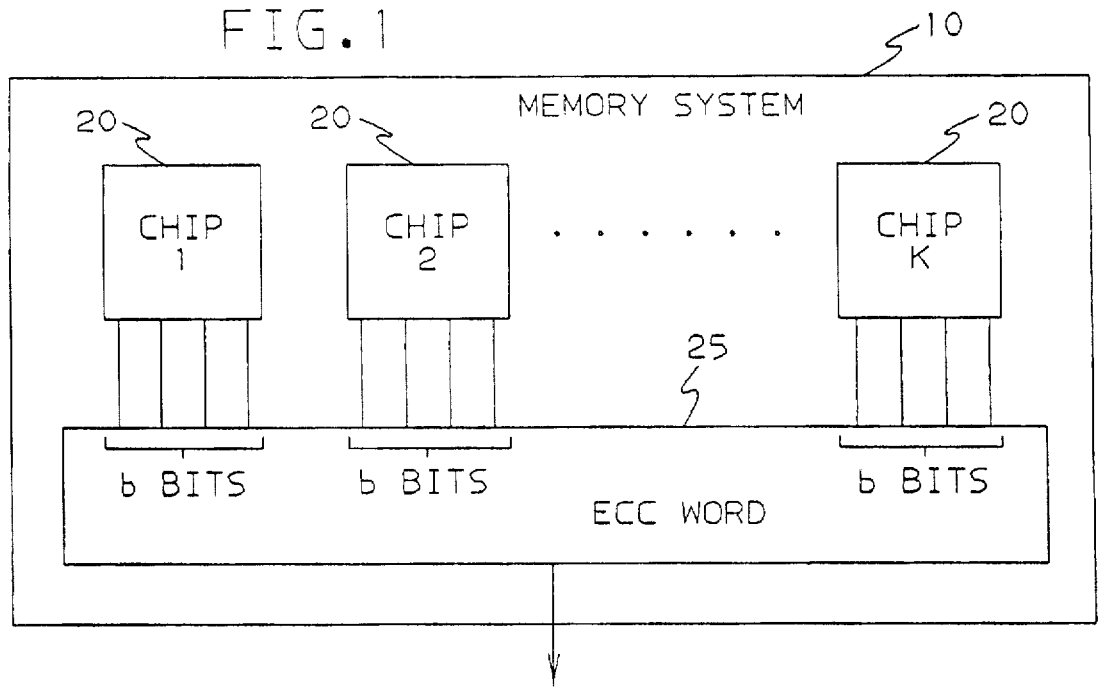
FIG. 1 is an overall block diagram illustrating a memory system in which a memory word is stored on k separate chips each providing b bits to a computer memory system register.

In accordance with the parity check matrix shown, each of the 12 ECC check bits is generated by exclusive OR circuits which take a subset of 64 data bits as indicated by the 1's in each row of the parity check matrix above. For example, the first check bit is generated by exclusive ORing data found at positions 1, 5, 9, 13, 17, 21, 25 29, 33, 36, 37, 38, 40, 41, 42, 43, 44, 47, 48, 49, 50, 53, 54, 57, 58, 59, 62 and 63. The other 11 check bits are similarly generated from the other 11 rows in the parity check matrix. The set of 64 data bits together with the 12 check bits generated from the data bits form an ECC word. The ECC word is divided into 19 groups of 4-bit symbols. In storing data, the ECC word with its 19 symbols, is stored into 19 different chips. That is, each symbol is stored on a different chip. This situation is illustrated in FIG. 1 wherein memory system 10 is shown to be organized using k chips with b bits being delivered from each chip at a time. Thus, the ECC word in register 25 is kb bits long. For the example illustration herein, k=19 and b=4.

Figure 2:
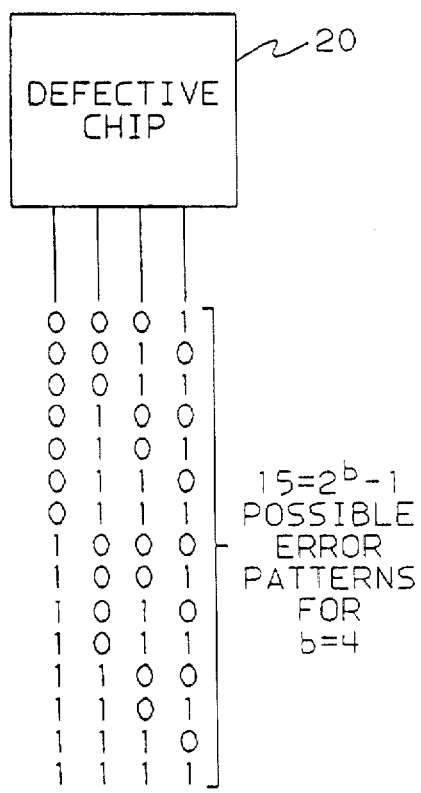
FIG. 2 is a functional block diagram illustrating the 15 possible error patterns for the case in which there are four bits per chip.
Figure 3:
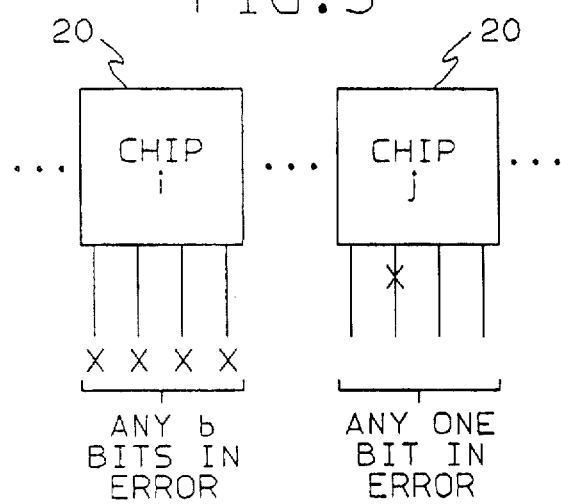
FIG. 3 is a functional block diagram illustrating the limits of error detectability for the circuits of the present invention.

When an array chip, say chip i, fails, the data stored in chip i may or may not be in error depending on the data stored. If the data is an error, the number of errors may be 1, 2, 3 or 4. This is illustrated in FIG. 2 where all of the $2^b-1=15$ possible error patterns are shown. Each of these patterns represents an error situation which may be corrected by the coding system of the present invention. Additionally, FIG. 3 illustrates the limits of error detectability in the present invention and particularly shows the situation in which chip i produces from one to four errors and in which only a single error occurs in a separate chip j. In FIGS. 1, 2 and 3, reference numeral 20 refers to the individual memory chips.

When data is fetched from storage, the syndrome is generated from the fetched data word according to the parity check matrix as indicated above. In the present example, there are 12 syndrome bits. Syndrome bit i is the exclusive- OR of the fetched data word at the positions specified by the 1's in the ith row of the parity check matrix. That is to say, the syndrome is generated from the fetched data word by supplying specified signals to an exclusive-OR gate. There are 12 such exclusive-OR gates because there are 12 rows in the parity check matrix. For each row in the parity check matrix, the 1's indicate which of the electrical signals are to be supplied to that particular exclusive-OR gate. It is important to bear in mind that while reference is made herein to an exclusive-OR gate it is quite likely in practice to employ trees of exclusive-OR gates when the number of signals input to a given exclusive-OR gate function becomes excessive in terms of the specific technology employed. In such cases exclusive-OR gate trees may be employed. These are all design considerations well understood by those of ordinary skill in the error correcting arts.

Furthermore, in accordance with the present invention, the parity check matrix is divided into 19 column matrices each of which is four columns wide. Furthermore, each of these 19 column matrices is further subdivided into three submatrices each of which has four rows and four columns. In the general case, such submatrices would have b rows and b columns. Thus, the parity check matrix can be represented as follows:

$$H = \begin{bmatrix} M_{1,1} & M_{1,2} & \ldots & M_{1,19} \\ M_{2,1} & M_{2,2} & \ldots & M_{2,19} \\ M_{3,1} & M_{3,2} & \ldots & M_{3,19} \end{bmatrix}$$

Each $M_{j,i}$ is a four by four matrix. It is important for considerations herein that one of these three submatrices in each column be a four by four identity matrix. This property is important and is used to facilitate error correction. That is, for each i from one to nineteen there will be a value of j from one to three such that $M_{j,i}$ is a four by four identity matrix.

Thus, for a fixed value of i there is one matrix from the set $M_{1,i}$, $M_{2,i}$, and $M_{3,i}$ that is the requisite identity matrix.

If the $i^{th}$ symbol is in error, the symbol error can be expressed as $E_i = (e_{i1}, e_{i2}, e_{i3}, e_{i4})$. If the $j^{th}$ bit is in error then $e_{ij}=1$. Otherwise, $e_{ij}=0$. If the word fetched from memory is error free, the syndrome is a vector which is entirely 0's, that is, it is the null vector. If chip i fails and there are thus errors in symbol i, the syndrome is equal to $$\begin{bmatrix} M_{1,i} \\ M_{2,i} \\ M_{3,i} \end{bmatrix} E_i'$$

where $E_i'$ is the transpose of $E_i$, and in accordance with well understood principles, the addition operation is taken modulo 2. Further suppose that the syndrome vector S is divided into three subsyndrome components, $S=(S_{i1}, S_{i2}, S_{i3})$ where each of the three components is a four-bit vector. That is to say, $S_{ij}' = M_{ji} E i'$. Since one of $M_{1,i}$, $M_{2,i}$, $M_{3,i}$ is a four by four identity matrix, one of the $S_{ji}$ where j=1 to 3 is identical to $E_i$. This assumes that there has been an error in one and only one symbol position.

For example, consider the case of the 9th symbol position, that is i=9. In this particular case it is seen from the parity check matrix above that $M_{2,9}$ is an identity matrix. If symbol 9 is indeed in error with error pattern E, then $S_{2,9}=E$. Thus the error pattern can be determined from the middle section of the syndrome, that is, from syndrome bits 5, 6, 7 and 8. This is a situation for the case of the 9th symbol. Other symbol positions will have other corresponding indicative syndrome bits representing the error pattern E.

However, it is to be furthermore noted that symbol 9 is in error if and only if the first four bits of the syndrome are equal to $M_{1,9} S_{2,9}'$, and the last four bits of the syndrome are also equal to $M_{3,9} S_{2,9}'$. In general, to determine if symbol i is in error the syndrome is divided into three components $S=(S_1, S_2, S_3)$. We determine j such that $M_{ji}$ is an identity matrix for j lying between 1 and 3. We then test if $S_i' = M_{ji} S_j'$ for i≠j and for j ranging from 1 to 3. If the test is valid, the error pattern is given by $S_j$.

Suppose that $E_i$ is the error indicator for symbol i. Thus, $E_i=1$ if symbol i is in error and $E_i=0$ if symbol i is not in error. Let $S_i$ be the corresponding syndrome bits. Then the logical operations required to determine the error indicators and associated error patterns are described in Table 2 below. In the table below (derived from the considerations set forth immediately above), it is noted that the equal sign is used in two different senses. The first equal sign on the left uses the symbol in its usual sense. However, where the equal sign appears between braces it represents the logic function of equivalence. This logic function is the same as the negative of the exclusiveOR logical function. Likewise, the table expresses the AND function by employing juxtaposed logical expressions separated by braces.

TABLE II

| | |
|---|---|
| E1 = | {S5 = (S2 XOR S3 )}{S6 = (S1 XOR S2 XOR S4 )} {S7 = (S1 XOR S3 XOR S4 )}{S8 = S5}{S9 = S1 } {S10 = S2 }{S11 = S3 }{S12 = S4 } |
| E2 = | {S5 = S1 }{S6 = S2 }{S7 = S3 }{S8 = S4 } {S9 = (S1 XOR S2 XOR S3 )}{S10 = (S1 XOR S4 )} {S11 = S10}{S12 = (S2 XOR S3 XOR S4 )} |
| E3 = | {S5 = S3 }{S6 = S4 }{S7 = (S1 XOR S3 )} {S8 = (S2 XOR S4 )}{S9 = (S2 XOR S3 XOR S4 )} {S10 = (S1 XOR S2 XOR S3 )}{S11 = S10} {S12 = (S1 XOR S4 )} |
| E4 = | {S5 = (S1 XOR S3 XOR S4 )}{S6 = (S2 XOR S3 )} {S7 = (S1 XOR S2 XOR S4 )}{S8 = S5} {S9 = (S1 XOR S3 )}{S10 = (S2 XOR S4 )}{S11 = S1 } {S12 = S2 } |
| E5 = | {S5 = (S1 XOR S3 )}{S6 = (S2 XOR S4 )}{S7 = S1 } {S8 = S2 }{S9 = (S1 XOR S4 )}{S10 = (S2 XOR S3 XOR S4 )} {S11 = S10}{S12 = (S1 XOR S2 XOR S3 )} |
| E6 = | {S5 = (S1 XOR S2 XOR S4 )}{S6 = (S1 XOR S3 XOR S4 )} {S7 = (S2 XOR S3 )}{S8 = S5}{S9 = S3 } {S10 = S4 }{S11 = (S1 XOR S3 )}{S12 = (S2 XOR S4 )} |
| E7 = | {S5 = (S2 XOR S4 )}{S6 = (S1 XOR S2 XOR S3 XOR S4 )} {S7 = S2 }{S8 = (S1 XOR S2 )}{S9 = (S2 XOR S3 )} {S10 = (S1 XOR S2 XOR S4 )}{S11 = (S1 XOR S3 XOR S4 )} {S12 = S9} |
| E8 = | {S5 = (S1 XOR S2 XOR S3 )}{S6 = (S1 XOR S4 )} {S7 = S6}{S8 = (S2 XOR S3 XOR S4 )}{S9 = S4 } {S10 = (S3 XOR S4 )}{S11 = (S2 XOR S4 )} {S12 = (S1 XOR S2 XOR S3 XOR S4 )} |
| E9 = | {S1 = (S5 XOR S8 )}{S2 = (S6 XOR S7 XOR S8 )} {S3 = S2}{S4 = (S5 XOR S6 XOR S7 )} {S9 = (S6 XOR S8 )}{S10 = (S5 XOR S6 XOR S7 XOR S8 )} {S11 = S6 }{S12 = (S5 XOR S6 )} |
| E10 = | {S1 = (S9 XOR S10 XOR S12 )}{S2 = (S9 XOR S11 XOR S12 )} {S3 = (S10 XOR S11 )}{S4 = S1} {S5 = S12}{S6 = (S11 XOR S12 )}{S7 = (S10 XOR S12 )} {S8 = (S9 XOR S10 XOR S11 XOR S12 )} |
| E11 = | {S1 = (S5 XOR S6 XOR S7 XOR S8 )}{S2 = (S5 XOR S7 )} {S3 = (S5 XOR S6 )}{S4 = S5 }{S9 = (S5 XOR S7 XOR S8 )} {S10 = (S6 XOR S7 )}{S11 = (S5 XOR S6 XOR S8 )} {S12 = S9} |
| E12 = | {S1 = (S11 XOR S12 )}{S2 = S11} {S3 = (S9 XOR S10 XOR S11 XOR S12 )}{S4 = (S9 XOR S11 )} {S5 = (S10 XOR S11 XOR S12 )}{S6 = (S9 XOR S10 XOR S11 )} {S7 = S6}{S8 = (S9 XOR S12 )} |
| E13 = | {S1 = (S5 XOR S6 )}{S2 = S5 }{S3 = (S7 XOR S8 )} {S4 = S7 }{S9 = (S6 XOR S7 )}{S10 = |

TABLE II-continued

```
         (S5 XOR S6 XOR S8 )}
         {S11 = (S5 XOR S7 XOR S8 )}{S12 = S9}
E14 =    {S1 = (S9 XOR S10 )}{S2 = S9 }{S3 = (S11 XOR S12 )}
         {S4 = S11}{S5 = (S9 XOR S10 XOR S11 )}
         {S6 = (S9 XOR S12 )}{S7 = S6}
         {S8 = (S10 XOR S11 XOR S12 )}
E15 =    {S1 = (S5 XOR S6 XOR S7 )}{S2 = (S5 XOR S8 )}
         {S3 = S2}{S4 = (S6 XOR S7 XOR S8 )}{S9 = S6 }
         {S10 = (S5 XOR S6 )}{S11 = S8 }{S12 = (S7 XOR S8 )}
E16 =    {S1 = (S10 XOR S11 )}{S2 = (S9 XOR S10 XOR S12 )}
         {S3 = (S9 XOR S11 XOR S12 )}{S4 = S1}
         {S5 = S10}{S6 = (S9 XOR S10 )}{S7 = S12}
         {S8 = (S11 XOR S12 )}
E17 =    {S5 = 0}{S6 = 0}{S7 = 0}{S8 = 0}{S9 = 0}{S10 = 0}
         {S11 = 0}{S12 = 0}
E18 =    {S1 = 0}{S2 = 0}{S3 = 0}{S4 = 0}{S9 = 0}{S10 = 0}
         {S11 = 0}{S12 = 0}
E19 =    {S1 = 0}{S2 = 0}{S3 = 0}{S4 = 0}{S5 = 0}{S6 = 0}
         {S7 = 0}{S8 = 0}
Error pattern for symbols 1, 2, 3, 4, 5, 6, 7, 8, and 17 =
(S1, S2, S3, S4)
Error pattern for symbols 9, 11, 13, 15, 18 =
(S5, S6, S7, S8)
Error pattern for symbols 10, 12, 14, 16, 19 =
(S9, S10, S11, S12)
```

Figure 6:
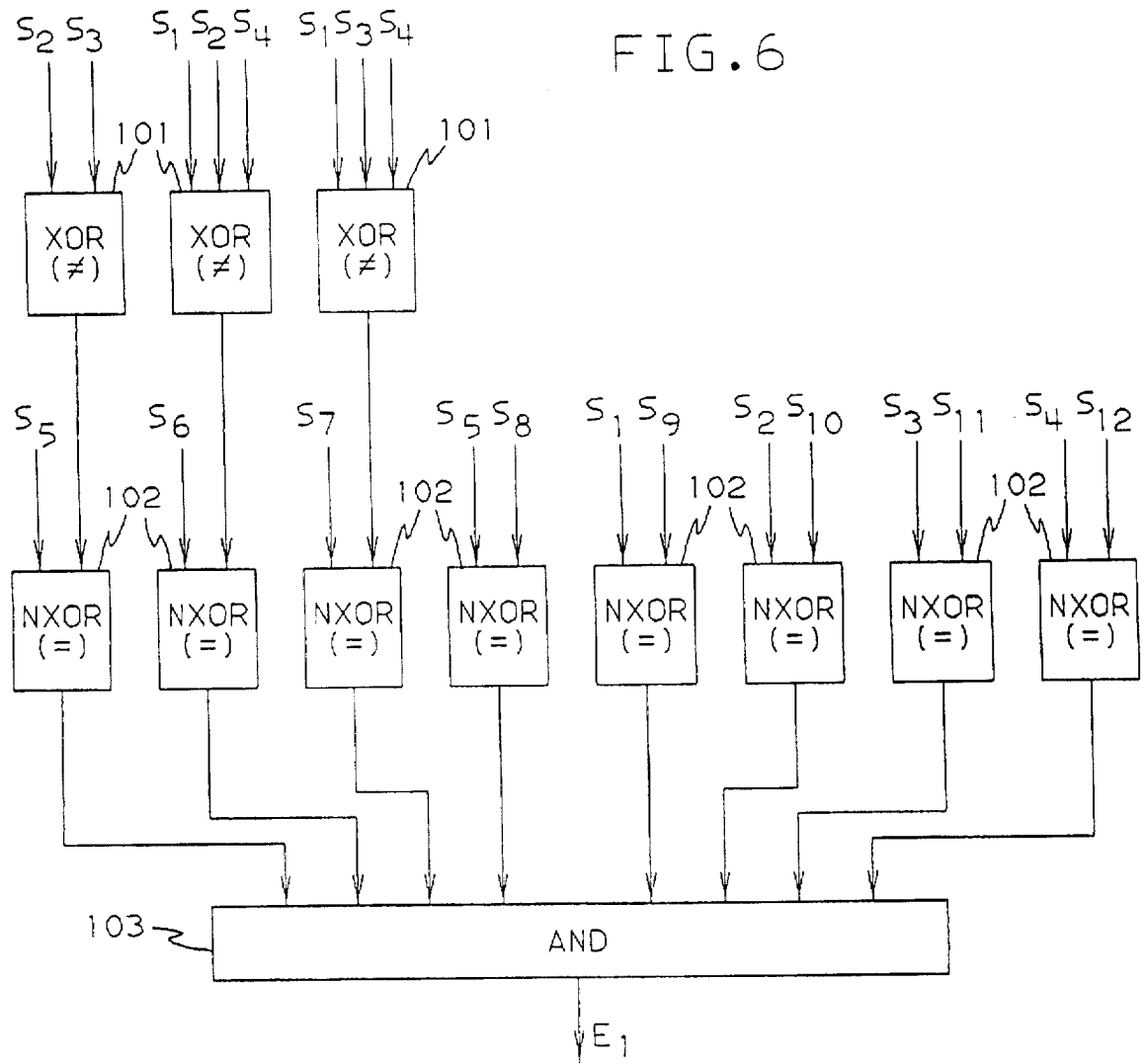
FIG. 6 is a functional block diagram illustrating the circuitry employed in the generation of an error indicator, $E_1$, for the first symbol or chip position.

In particular, for the case of the error indicator for the first symbol, $E_1$, FIG. 6 illustrates the electrical circuit employed to produce the functionality set out in Table II above for $E_1$. In particular, it is seen that signals $S_2$, $S_3$, $S_1$ and $S_4$ are supplied to three exclusive-OR gates 101 as shown in FIG. 6. Likewise in a second layer of equality testing circuits, that is circuits 102 which are negative exclusive-OR gates, corresponding signals are supplied as inputs thereto in addition to the signal outputs from three exclusive-OR gates 101. The outputs of all of the NXOR gates 102 are supplied to AND gate 103 to provide the error indicator signal $E_1$ whose use is more particularly illustrated in FIG. 4.

Figure 4:
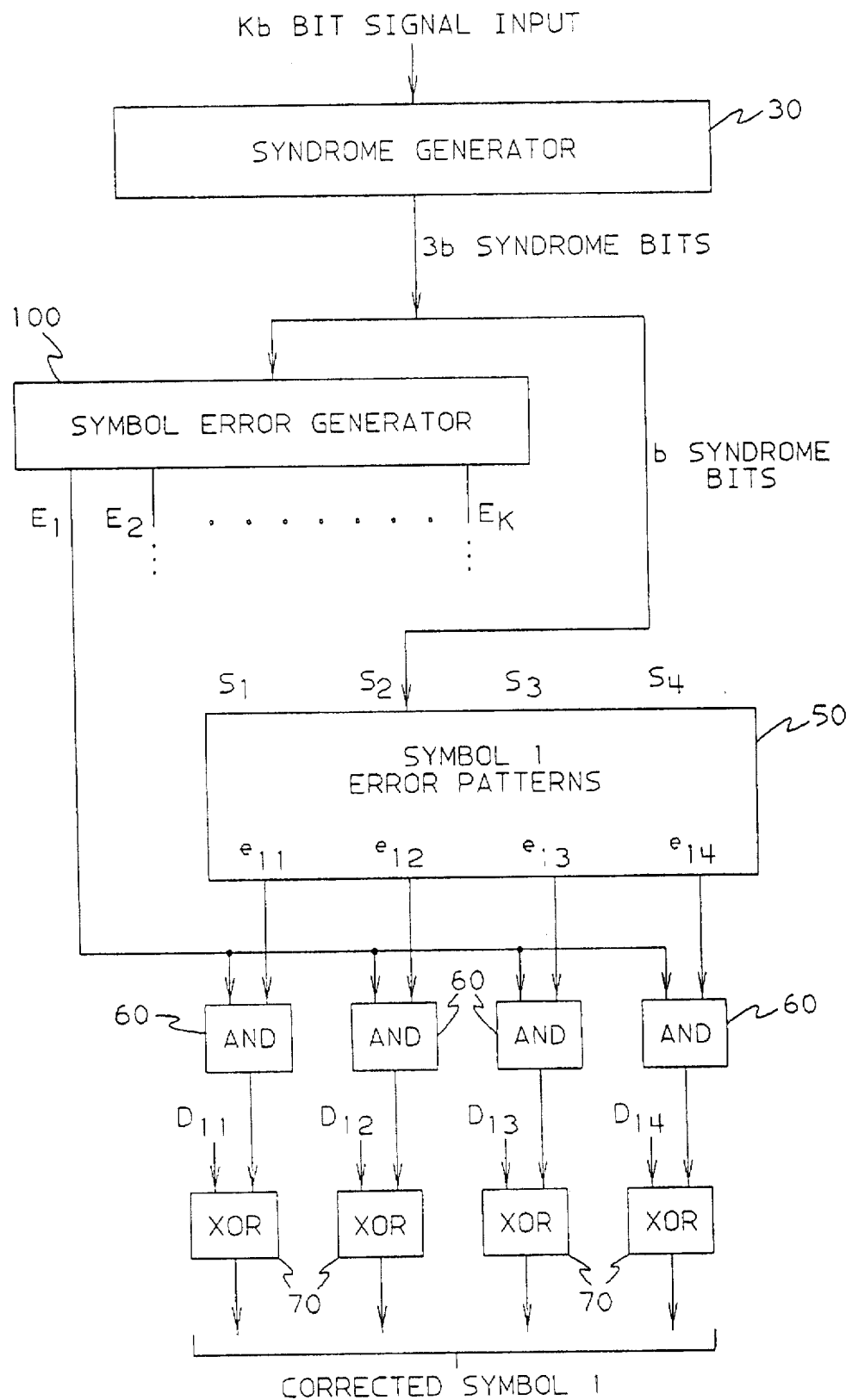
FIG. 4 is a block diagram illustrating the overall circuitry for error correction in the present invention and more particularly illustrating the correction for symbol one.

As understood from FIG. 4 and from the table above and its interpretation provided above for $E_1$ it is appreciated that symbol error generator 100 supplies, as its output, k=19 symbol error indicators $E_1$, $E_2$ through $E_k$. FIG. 4 particularly addresses the correction circuits for symbol 1. The correction circuitry for the other circuits are similarly determined from Table II above.

Figure 5:
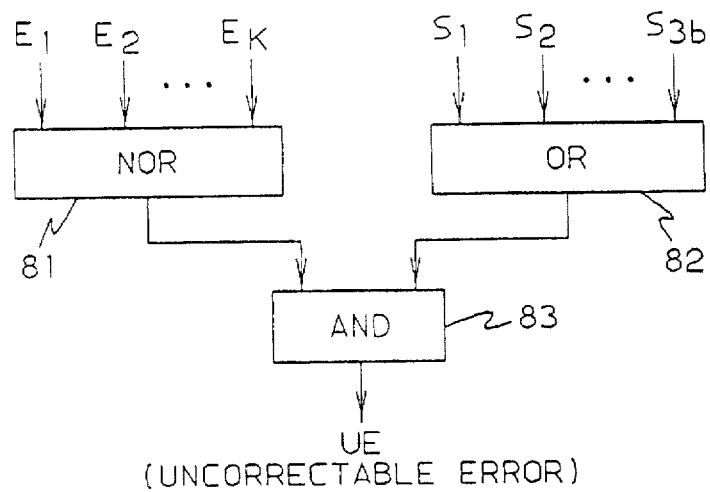
FIG. 5 is a functional block diagram illustrating the electrical circuitry employed in the present invention for the generation of uncorrectable error situations.

Accordingly, attention is now specifically directed to FIG. 4 which illustrates the overall correction process for symbol 1. In particular, syndrome generator 30 is supplied with kb bit signal input lines. The syndrome bits are generated as described above. All of the syndrome bits are supplied to symbol error generator 100 which produces as its output 19 symbol error indicator values for determining which of the k symbols is to be corrected. Functional block 50 illustrates the selection of d of the syndrome bits which are to be employed as the error pattern for correction. In the code described herein the symbol error pattern is either ($S_1$, $S_2$, $S_3$, $S_4$) or ($S_5$, $S_6$, $S_7$, $S_8$) or ($S_9$, $S_{10}$, $S_{11}$, $S_{12}$). In particular for the case of symbol number 1, the symbol error pattern is provided by the first four syndrome bits, ($S_1$, $S_2$, $S_3$, $S_4$). These error patterns bits $E_{11}$, $E_{12}$, $E_{13}$ and $E_{14}$ are supplied to AND gates 60 which are also supplied with symbol error indicator $E_1$ which thus controls whether or not any correction is to be provided to symbol 1. If $E_1$ is 1 then the data bits for symbol one namely $D_{11}$, $D_{12}$, $D_{13}$ and $D_{14}$ are corrected by supplying the output from AND gate 60 to the respective exclusive-OR gate 70 as shown in FIG. 4. However, in the situation in which the syndrome vector is not null and none of the output lines from symbol error generator 100 is activated, then the mechanism of the present invention provides an uncorrectable error indicator. The circuit for accomplishing this is shown in FIG. 5 wherein signals $E_1$ through $E_k$ are supplied to NOR gate 81 and in which the syndrome bits are supplied to OR gate 82. The outputs from gates 81 and 82 are supplied to AND gate 83 which produces a high output when an uncorrectable error condition has arisen.

It should be seen from above that the coding method and circuits of the present invention have provided a mechanism for improved reliability and availability of computer memory systems. Furthermore it is seen that error correction and detection capabilities of the devised coding and decoding method is in full comport with the structure of relevant computer memory systems, namely, the structure in which multiple bits are stored on separate chips. Accordingly, it is seen that the present memory system well tracks appropriate errors as they might occur in such computer memory systems. It is further seen that the system of the present invention achieves its objectives with ease, relatively small chip real estate, and a reduction in the number of chips required to achieve the desired redundancy.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for decoding electrical signals to correct errors in symbols which are b bits in length, said method comprising the steps of:

generating an overall multisegment syndrome vector in which each segment is b bits long and in which one of said segments represents an error pattern for a symbol;

generating a multiplicity, k, of subsyndrome segments in which each segment is b bits long, and in which each of said k b-bit long subsyndrome segments is selected from the group consisting of the first third of said syndrome bits, the second third of said syndrome bits and the third third of said syndrome bits;

determining, for each of said k subsyndrome segments which one matches the corresponding overall syndrome vector in all of its segments excepting the segment representing the error pattern; and correcting the signal in those symbol bits for which said subsyndrome segment match is found, said correction being determined by the error pattern for that symbol.

2. The method of claim 1 further including the step of generating an uncorrectable error signal in the event that said overall syndrome is not null and there is at least one match found.

3. A method for encoding input digital electrical signals occurring in k blocks of b bits per block, said method comprising the step of generating electrical check bit signals by subjecting said input electrical signals to parity check conditions in an electrical circuit specified by a parity check matrix of the form $$H = \begin{bmatrix} M_{1,1} & M_{1,2} & \cdots & M_{1,19} \\ M_{2,1} & M_{2,2} & \cdots & M_{2,19} \\ M_{3,1} & M_{3,2} & \cdots & M_{3,19} \end{bmatrix},$$

where each matrix column includes a single identity matrix with b rows and b columns.

4. The method of claim 3 in which H is:

| 1000 | 1000 | 1000 | 1000 | 1000 | 1000 | 1000 | 1000 | 1001 | 1101 | 1111 | 0011 | 1100 | 1100 | 1110 | 0110 | 1000 | 0000 | 0000 |
|---|---|---|---|---|---|---|---|---|---|---|---|---|---|---|---|---|---|---|
| 0100 | 0100 | 0100 | 0100 | 0100 | 0100 | 0100 | 0100 | 0111 | 1011 | 1010 | 0010 | 1000 | 1000 | 1001 | 1101 | 0100 | 0000 | 0000 |
| 0010 | 0010 | 0010 | 0010 | 0010 | 0010 | 0010 | 0010 | 0111 | 0110 | 1100 | 1111 | 0011 | 0011 | 1001 | 1011 | 0010 | 0000 | 0000 |
| 0001 | 0001 | 0001 | 0001 | 0001 | 0001 | 0001 | 0001 | 1110 | 1101 | 1000 | 1010 | 0010 | 0010 | 0111 | 0110 | 0001 | 0000 | 0000 |
| 0110 | 1000 | 0010 | 1011 | 1010 | 1101 | 0101 | 1110 | 1000 | 0001 | 1000 | 0111 | 1000 | 1110 | 1000 | 0100 | 0000 | 1000 | 0000 |
| 1101 | 0100 | 0001 | 0110 | 0101 | 1011 | 1111 | 1001 | 0100 | 0011 | 0100 | 1110 | 0100 | 1001 | 0100 | 1100 | 0000 | 0100 | 0000 |
| 1011 | 0010 | 1010 | 1101 | 1000 | 0110 | 0100 | 1001 | 0010 | 0101 | 0010 | 1110 | 0010 | 1001 | 0010 | 0001 | 0000 | 0010 | 0000 |
| 0110 | 0001 | 0101 | 1011 | 0100 | 1101 | 1100 | 0111 | 0001 | 1111 | 0001 | 1001 | 0001 | 0111 | 0001 | 0011 | 0000 | 0001 | 0000 |
| 1000 | 1110 | 0111 | 1010 | 1001 | 0010 | 0110 | 0001 | 0101 | 1000 | 1011 | 1000 | 0110 | 1000 | 0100 | 1000 | 0000 | 0000 | 1000 |
| 0100 | 1001 | 1110 | 0101 | 0111 | 0001 | 1101 | 0011 | 1111 | 0100 | 0110 | 0100 | 1101 | 0100 | 1100 | 0100 | 0000 | 0000 | 0100 |
| 0010 | 1001 | 1110 | 1000 | 0111 | 1010 | 1011 | 0101 | 0100 | 0010 | 1101 | 0010 | 1011 | 0010 | 0001 | 0010 | 0000 | 0000 | 0010 |
| 0001 | 0111 | 1001 | 0100 | 1110 | 0101 | 0110 | 1111 | 1100 | 0001 | 1011 | 0001 | 0110 | 0001 | 0011 | 0001 | 0000 | 0000 | 0001 |

5. An electrical circuit for encoding input digital electrical signals occurring in K blocks of b bits per block, said circuit being described by a parity check matrix of the form $$H = \begin{bmatrix} M_{1,1} & M_{1,2} & \ldots & M_{1,19} \\ M_{2,1} & M_{2,2} & \ldots & M_{2,19} \\ M_{3,1} & M_{3,2} & \ldots & M_{3,19} \end{bmatrix},$$

where each matrix column includes a single identity matrix with b rows and b columns.

6. An apparatus for decoding electrical signals to correct errors in symbols which are b bits in length, said apparatus comprising:

means for generating an overall multisegment syndrome vector in which each segment is b bits long and in which one of said segments represents an error pattern for a symbol;

means for generating a multiplicity, k, of subsyndrome segments in which each segment is b bits long, and in which each of said k b-bit long subsyndrome segments is selected from the group consisting of the first third of said syndrome bits, the second third of said syndrome bits and the third third of said syndrome bits;

means for determining, for each of said k subsyndrome segments, which one matches the corresponding overall syndrome vector in all of its segments excepting the segment representing the error pattern; and means for correcting the signal in those symbol bits for which said subsyndrome segment match is found, said correction being determined by the error pattern for that symbol.

* * * * *

UNITED STATES PATENT AND TRADEMARK OFFICE
CERTIFICATE OF CORRECTION

PATENT NO. : 5,757,823
DATED : May 26, 1998
INVENTOR(S) : Chin-Long Chen et al.

It is certified that error appears in the above-identified patent and that said Letters Patent is hereby corrected as shown below:

Column 8, line 65, should be --where each matrix column $[M_{1,j}, M_{2,j}, M_{3,j}]^t$ includes a single identity matrix--

Signed and Sealed this

First Day of June, 1999

Attest:

Q. TODD DICKINSON

Attesting Officer

Acting Commissioner of Patents and Trademarks